United States Patent
Wada et al.

(10) Patent No.: US 7,119,729 B2
(45) Date of Patent: Oct. 10, 2006

(54) ANALOG-DIGITAL CONVERTER OPTIMIZED FOR HIGH SPEED OPERATION

(75) Inventors: Atsushi Wada, Ogaki (JP); Kuniyuki Tani, Ogaki (JP); Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/060,306

(22) Filed: Feb. 18, 2005

(65) Prior Publication Data

US 2005/0200511 A1    Sep. 15, 2005

(30) Foreign Application Priority Data

Mar. 8, 2004  (JP) ............... 2004-063599

(51) Int. Cl.
*H03M 1/38*  (2006.01)

(52) U.S. Cl. ...................... 341/161; 341/155

(58) Field of Classification Search ........... 341/155, 341/161, 172, 162, 118, 120, 126, 110, 145
See application file for complete search history.

(56) References Cited

U.S. PATENT DOCUMENTS

| | | | |
|---|---|---|---|
| 6,195,032 B1 * | 2/2001 | Watson et al. ............. | 341/162 |
| 6,366,230 B1 * | 4/2002 | Zhang et al. ............. | 341/162 |
| 6,396,429 B1 * | 5/2002 | Singer et al. ............. | 341/155 |
| 6,914,550 B1 * | 7/2005 | Cai ............. | 341/155 |
| 6,977,604 B1 * | 12/2005 | Wada et al. ............. | 341/155 |
| 6,987,477 B1 * | 1/2006 | Aude ............. | 341/161 |
| 7,002,507 B1 * | 2/2006 | Kobayashi et al. ......... | 341/162 |
| 2003/0006926 A1 * | 1/2003 | Nikai et al. | |

FOREIGN PATENT DOCUMENTS

JP    4-26229    1/1992

* cited by examiner

*Primary Examiner*—Jean Bruner Jeanglaude
(74) *Attorney, Agent, or Firm*—McDermott Will & Emery LLP

(57) ABSTRACT

A first analog-digital converter circuit in a preceding stage converts an input analog signal into a digital value and retrieves the higher 4 bits. A second analog-digital converter circuit in a subsequent stage converts an input analog signal into a digital value and retrieves 3 bits including the 5th through 6th highest bits and a redundant bit, 3 bits including the 7th through 8th highest bits and a redundant bit, and 3 bits including the 9th through 10th highest bits and a redundant bit. Thus, the number of bits produced by conversion by the second analog-digital converter circuit in the subsequent stage of a cyclic type is configured to be smaller than the number of bits produced by conversion by the first analog-digital converter circuit in the preceding stage.

20 Claims, 3 Drawing Sheets

ANALOG-DIGITAL CONVERTER OPTIMIZED FOR HIGH SPEED OPERATION

BACKGROUND OF THE INVENTION

1. Field of the Invention

The present invention relates to an analog-digital converter and, more particularly, to an analog-digital converter including an analog-digital conversion part of a cyclic part.

2. Description of the Related Art

In recent years, a variety of additional functions are built in mobile appliances such as a mobile telephone set, including the image pick-up function, the image playback function, the moving image pick-up function and the moving image playback function. In association with this, there is an increasing demand for miniaturization and power saving of an analog-digital converter (hereinafter, referred to as an AD converter). One mode of AD converter that addresses this demand is known as a cyclic AD converter that cycles through stages (see, for example, the Related art list No. 1).

RELATED ART LIST

1. Japanese Patent Application Laid-open No. 4-26229

Referring to FIG. 1 of the Related art list No. 1, the parallel AD converter AD1 in the preceding stage converts into the highest 4 bits. The cyclic parallel AD converter AD2 in the subsequent stage goes through 3 cycles so as to convert into the second highest 4 bits, the third highest 4 bits and the lowest 4 bits. Each of the bit groups produced by conversion in the subsequent stage includes one redundant bit. Thus, a total of 13 bits are produced by conversion in the preceding stage and the subsequent stage.

Since the parallel AD converter AD2 of the subsequent stage is assigned the task of converting into 3 bits excluding the redundant bit, signal amplification by a high gain of 8 is required before providing subsequent inputs to the parallel A/D converter AD2 in the subsequent stage.

However, the performance of an amplifier circuit is limited by a factor known as gain bandwidth product (GB product). The higher the target gain, the lower the operating frequency of the amplifier and the slower the operation. Accordingly, the amplifier circuit constitutes a limiting factor in the speed of operation of AD converter as a whole.

SUMMARY OF THE INVENTION

The present invention is done in view of the above-described circumstances and an object thereof is to improve the speed of an AD converter.

The present invention according to one aspect provides an analog-digital converter. The analog-digital converter according to this aspect is an analog-digital converter converting an input analog signal into a digital value using a plurality of stages, wherein the plurality of stages include the feedback stage feeding back an output of the stage to an input of the stage, and the number of bits produced in a single cycle of conversion in a feedback stage subsequent to a given stage is smaller than the number of bits produced by conversion in the given stage.

Arbitrary combinations of the aforementioned constituting elements, and implementations of the invention in the form of methods, apparatus and systems may also be practiced as additional modes of the present invention.

DETAILED DESCRIPTION OF THE INVENTION

Figure 1:
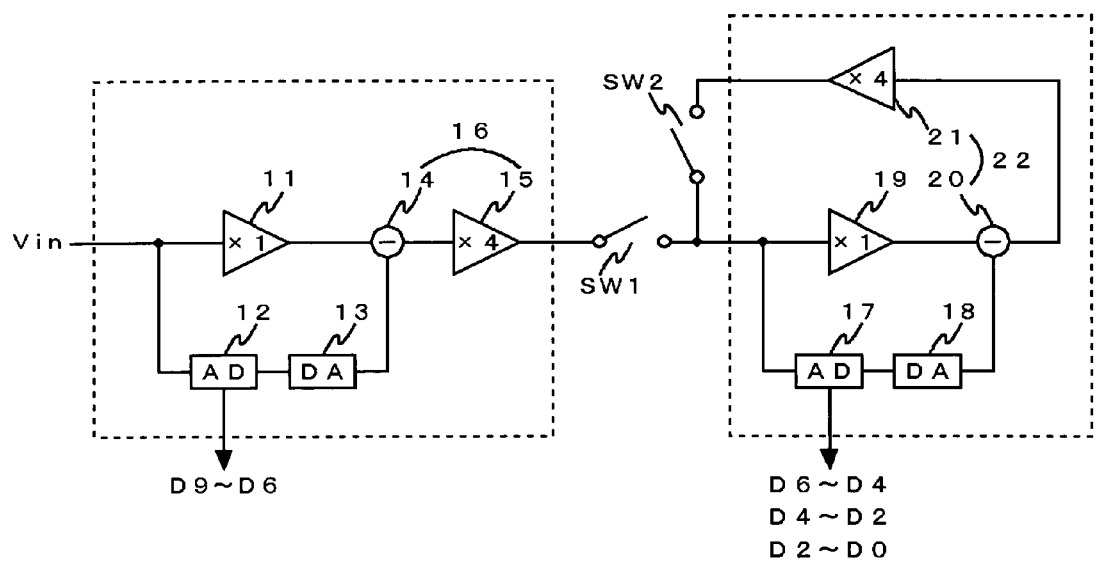
FIG. 1 illustrates the structure of an AD converter according to a first embodiment.

A representative aspect of the present invention will be described. The present invention according to one aspect of the present invention is an analog-digital converter. The analog-digital converter according to this aspect is an analog-digital converter converting an input analog signal into a digital value using a plurality of stages, wherein the plurality of stages include a feedback stage feeding back an output of the stage to an input of the stage, and the number of bits produced in a single cycle of conversion in the feedback stage subsequent to a given stage is smaller than the number of bits produced by conversion in the given stage.

According to this aspect, by configuring the number of bits produced in a single cycle of conversion in a stage subsequent to a given stage to be smaller than the number of bits produced by conversion in the given stage, the gain required in the feedback stage, which limits the overall speed, is lowered. Consequently, the operation of AD converter as a whole is improved. Associated with this, the number of voltage comparison elements constituting the associated AD conversion part is reduced so that the load from the voltage comparison elements is reduced and the circuit area is reduced. The bits produced in a single cycle of conversion in the feedback stage may include one redundant bit.

The present invention according to another aspect also provides an analog-digital converter. The analog-digital converter according to this aspect is an analog-digital converter converting an input analog signal into a digital value using a plurality of stages, wherein a preceding stage amplifies, by a predetermined gain, an analog signal obtained by removal, from an analog signal input to the preceding stage, of an analog signal component corresponding to a digital value derived from analog-to-digital conversion in the preceding stage, and outputs the amplified signal to a subsequent stage, the subsequent stage is a feedback stage including a subsequent-stage amplifier circuit which amplifies, by a predetermined gain, a difference between an analog signal input from the preceding stage and an analog signal derived from digital-to-analog conversion from a digital value derived from analog-to-digital conversion in the subsequent stage, and which feeds back the amplified difference to an input of the subsequent stage, and the number of bits produced in a single cycle of conversion in the subsequent stage is smaller than the number of bits produced by conversion in the preceding stage.

According to this aspect, by configuring the number of bits produced in a single cycle of conversion in the subsequent stage to be smaller than the number of bits produced by conversion in the preceding stage, the gain required in the feedback stage, which limits the overall speed, is lowered. Consequently, the operation of AD converter as a whole is improved. Associated with this, the number of voltage comparison elements constituting the associated AD conversion part is reduced so that the load from the voltage comparison elements is reduced and the circuit area is reduced. The bits produced in a single cycle of conversion in the feedback stage may include one redundant bit.

The present invention according to still another aspect also provides an analog-digital converter. The analog-digital converter according to this aspect is an analog-digital converter converting an input analog signal into a digital value using a plurality of stages, wherein a preceding stage amplifies, by a predetermined gain, an analog signal obtained by removal, from an analog signal input to the preceding stage, of an analog signal component corresponding to a digital value derived from analog-to-digital conversion in the preceding stage, and outputs the amplified signal to a subsequent stage, the subsequent stage is a feedback stage including a first subsequent-stage amplifier circuit amplifying an analog signal input from the preceding stage by a first predetermined gain, and a second subsequent-stage amplifier circuit amplifying, by a second predetermined gain, a difference between an analog signal output from the first subsequent-stage amplifier, and an analog signal which is derived from digital-to-analog conversion from a digital value derived from analog-to-digital conversion in the subsequent stage, and which is amplified by a gain practically identical with the first predetermined gain, the second subsequent-stage amplifier feeding back the amplified difference to an input of the subsequent stage, and the number of bits produced in a single cycle of conversion in the subsequent stage is smaller than the number of bits produced by conversion in the preceding stage.

According to this aspect, by configuring the number of bits produced in a single cycle of conversion in the subsequent stage to be smaller than the number of bits produced by conversion in the preceding stage, the gain required in the subsequent-stage amplifier circuits in the feedback stage, which limits the overall speed, is lowered. Consequently, the operation of AD converter as a whole is improved. Since the amplification in the subsequent stage is conducted in two steps using the first subsequent-stage amplifier circuit and the second subsequent-stage amplifier circuit, the gain required in each step is lowered. Accordingly, input of the clock signal for timing the operation of elements constituting the two-step subsequent stage can occur earlier than in the case of one-step amplification in the subsequent stage. The bits produced in a single cycle of conversion in the feedback stage may include one redundant bit. The predetermined gain may be 1.

In a case where the preceding stage is a feedback stage that feeds back to an input of the preceding stage as well as outputting to the subsequent stage, the number of bits produced by conversion in a single step of conversion in the subsequent feedback stage may be configured to be smaller than the number of bits produced in an initial step of conversion in the preceding stage. With this, allocation of bits for improving the operation of AD converter as a whole is possible in a case where the preceding stage is also a feedback stage.

The number of bits produced by conversion in the subsequent feedback stage may be 2, excluding the redundant bit. With this, the overall bit structure can be flexibly modified to include 6 bits, 8 bits, 10 bits, 12 bit, etc., simply by changing the number of cycles in which the subsequent feedback stage goes through.

FIRST EMBODIMENT

The first embodiment provides an AD converter in which a preceding stage of a non-cyclic type converts into 4 bits and a subsequent stage of a cyclic type converts into 2 bits in each cycle. By allowing the subsequent stage to go through 3 cycles, a total of 10 bits are output.

FIG. 1 illustrates the structure of an AD converter according to the first embodiment. A description will be given of the preceding stage of the AD converter. The input analog signal Vin is fed to a first amplifier circuit 11 and a first AD converter circuit 12. The first AD converter circuit 12 is of a flash type and the resolution thereof, i.e. the number of bits produced by conversion therein, is 4 bits. The first AD converter circuit 12 converts the input analog signal into a digital value, retrieves the higher 4 bits (D9–D6) and outputs the bits to an encoder (not shown) and a first DA converter circuit 13. The first DA converter circuit 13 converts the digital value produced by conversion by the first AD converter circuit 12 into an analog value. The first amplifier circuit 11 samples the input analog signal, holds the sampled signal for a predetermined period of time and outputs the held signal to a first subtracter circuit 14. The first amplifier circuit 11 does not amplify the analog signal and functions as a sample and hold circuit. The first subtracter circuit 14 subtracts an output of the first DA converter circuit 13 from the output of the first amplifier circuit 11. A second amplifier circuit 15 amplifies the output of the first subtracter circuit 14 by a gain of 4. In order for a second AD converter circuit 17 to convert into 2 bits, the analog signal subjected to the conversion in the first AD converter circuit 12 should practically be amplified by a gain of 4 (2 raised to the 2nd power). The first subtracter circuit 14 and the second amplifier circuit 15 may be an integral subtracting amplifier circuit 16. In this way, the circuit is simplified.

A description will now be given of the subsequent stage. A first switch SW1 and a second switch SW2 are alternately turned on and off. The analog signal input from the preceding stage via the first switch SW1 when the first switch SW1 is turned on and the second switch SW2 is turned off is fed to a third amplifier circuit 19 and a second AD converter circuit 17. The second AD converter circuit 17 is also of a flash type and the resolution thereof, i.e. the number of bits including the redundant 1 bit, is 3 bits. The second AD converter circuit 17 converts the input analog signal into a digital value, retrieves 3 bits (D6–D4) including the 5th through 6th highest bits and the redundant bit, and outputs the bits to the encoder (not shown) and a second DA converter circuit 18. The second DA converter circuit 18 converts the digital value produced by conversion by the second AD converter circuit 17 into an analog value.

The third amplifier circuit 19 samples the input analog signal, holds the sampled signal for a predetermined period of time, and outputs the held signal to a second subtracter circuit 20. The third amplifier circuit 19 does not amplify the analog signal and functions as a sample and hold circuit. The second subtracter circuit 20 subtracts the output of the second DA converter circuit 18 from the output of the third amplifier circuit 19 and outputs the result to a fourth amplifier circuit 21.

The fourth amplifier circuit 21 amplifies the output of the second subtracter circuit 20 by a gain of 4. At this point of time, the first switch SW1 is turned off and the second switch SW2 has made a transition to an on state. The analog signal amplified by the fourth amplifier circuit 21 is fed back to the third amplifier circuit 19 and the second AD converter circuit 17 via the second switch SW2. The second subtracter circuit 20 and the fourth amplifier circuit 21 may be a second subtracting amplifier circuit 22 of an integral type. The process described above is repeated so that the second AD converter circuit retrieves 3 bits (D4–D2) including the 7th through 8th highest bits and the redundant bit, and 3 bits (D2–D0) including the 9th through 10th highest bits and the redundant bit. With this, a 10-bit digital value is obtained. The 5th through 10th highest bits are obtained by the subsequent stage of a cyclic type.

Figure 2:
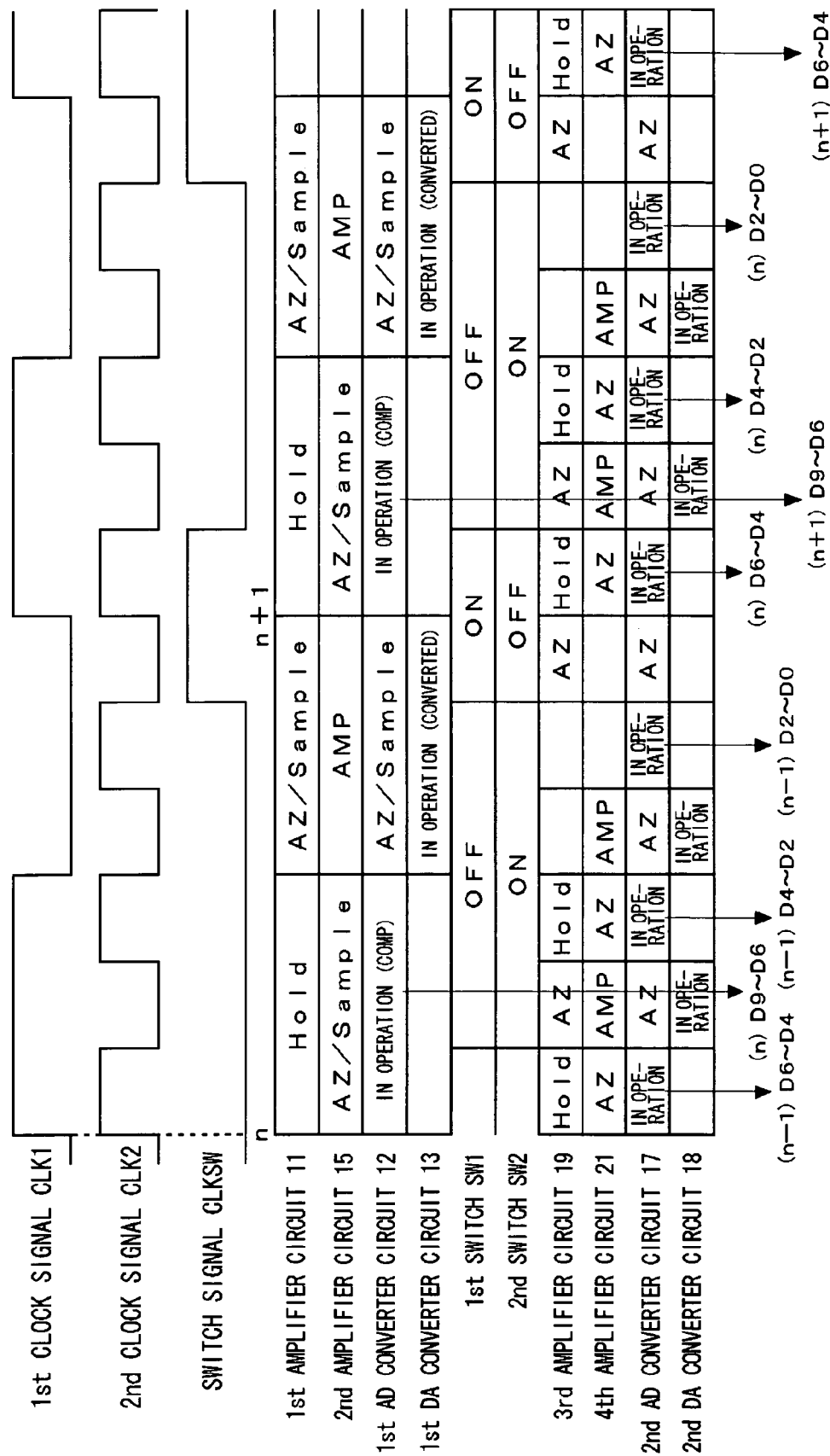
FIG. 2 is a time chart showing the operation process in the AD converter according to the first embodiment.

FIG. 2 is a time chart illustrating the operating process of the AD converter according to the first embodiment. The process will be described from the first step downward in the figure. Three waveforms at the top are for a first clock signal CLK1, a second clock signal CLK2 and a switch signal CLKSW in the illustrated order. The first clock signal CLK1 controls the operation of the first amplifier circuit 11, the second amplifier circuit 15, the first AD converter circuit 12 and the first DA converter circuit 13. The second clock signal CLK2 controls the operation of the third amplifier circuit 19, the fourth amplifier circuit 21, the second AD converter circuit 17 and the second DA converter circuit 18. The switch signal CLKSW effects on/off control of the first switch SW1 and the second switch SW2.

The frequency of the second clock signal CLK2 is three times that of the first clock signal CLK1. The second clock signal CLK2 may be generated by multiplying the first clock signal CLK1 using a PLL or the like. A rising edge of the second clock signal CLK2 is synchronized with a rising edge of the first clock signal CLK1. Subsequently, a third falling edge of the second clock signal CLK2 is synchronized with a second falling edge of the first clock signal CLK1. Further, a fourth rising edge of the second clock signal CLK2 is synchronized with a second rising edge of the first clock signal CLK1. Since the frequency of the second clock CLK2 is three times that of the first clock signal CLK1, the conversion speed in the subsequent stage is three times that of the conversion speed in the preceding stage. Analog processes such as subtraction and amplification for conversion into relatively higher bits largely affect overall precision in conversion. Therefore, higher precision is required of the preceding stage responsible for conversion into relatively higher bits. In this respect, it is possible to increase the speed of operation in the subsequent stage as compared to the preceding stage, since the subsequent stage is not required to provide precision as high as that required in the preceding stage.

The first amplifier circuit 11 and the first AD converter circuit 12 sample the input analog signal Vin at a rising edge of the first clock signal CLK1. The first amplifier circuit 11 holds the sampled analog signal when the first clock signal CLK1 is high and is placed in an autozero operation mode when the first clock signal CLK1 is low. The second amplifier circuit 15 samples the input analog signal at a falling edge of the first clock signal CLK1. When the first clock signal CLK1 is low, the second amplifier circuit 15 amplifies the sampled analog signal and outputs the amplified signal to the third amplifier circuit 19 and the second AD converter circuit 17. When the first clock signal CLK1 is high, the second amplifier circuit 15 is placed in an autozero operation mode. When the first subtracting amplifier circuit 16 is used in place of the second amplifier circuit 15, the first subtracting amplifier circuit 16 subjects the sampled analog signal to subtraction and amplification when the first clock signal CLK1 is low. The first AD converter circuit 12 converts into a digital value comprising the D9–D6 bits for output when the first clock signal CLK1 is high and is placed in an autozero operation mode when the first clock signal CLK1 is low. The first DA converter circuit 13 holds the converted data when the first clock signal CLK1 is low and is in an undefined state when the first clock signal CLK1 is high.

The first switch SW1 is turned on when the switch signal CLKSW is high and turned off when the switch signal CLKSW is low. The second switch SW2 is turned on when the switch signal CLKSW is low and turned off when the switch signal CLKSW is high.

The third amplifier circuit 19 and the second AD converter circuit 17 sample the input analog signal at a rising edge of the second clock signal CLK2. The third amplifier circuit 19 holds the sampled analog signal when the second clock signal CLK2 is high and is placed in an autozero operation mode when the second clock signal CLK2 is low. The third amplifier circuit 19 does not hold when the second AD converter circuit 17 converts into the lowest bits D2–D0. The fourth amplifier circuit 21 samples the input analog signal at a falling edge of the second clock signal CLK2. The fourth amplifier circuit 21 amplifies the sampled analog signal when the second clock signal CLK2 is low and is placed in an autozero operation mode when the second clock signal CLK2 is high. When the second subtracting amplifier circuit 22 is used in place of the fourth amplifier circuit 21, the second subtracting amplifier circuit 22 subjects the sampled analog signal to subtraction and amplification when the second clock signal CLK2 is low. Amplification is not performed during the subsequent half-clock period after the second AD converter circuit 17 converted into the bits D2–D0.

When the second clock signal CLK2 is high, the second AD converter circuit 17 converts into 3 bits, including the redundant bit, for output. The second AD converter 17 is placed in an autozero operation mode when the second clock signal CLK2 is low. The second DA converter circuit 18 holds the converted data when the second clock signal CLK2 is low and is in an undefined state when the second clock signal CLK2 is high. Conversion is not performed when the second AD converter circuit 17 outputs the bits D2–D0.

In an autozero period, the first amplifier circuit 11, the second amplifier circuit 15, the third amplifier circuit 19, the fourth amplifier circuit 21, the first AD converter circuit 12 and the second AD converter circuit 17 are operating to sample the input signal. As shown, while the second AD converter circuit 17 is converting into D6–D4 and D4–D2, the first AD converter circuit 12 is converting from a subsequently input analog signal Vin concurrently. According to the pipeline process as described above, the AD converter as a whole is capable of outputting a digital value of 10 bits once in a cycle defined by the first clock signal CLK1.

Figure 3:
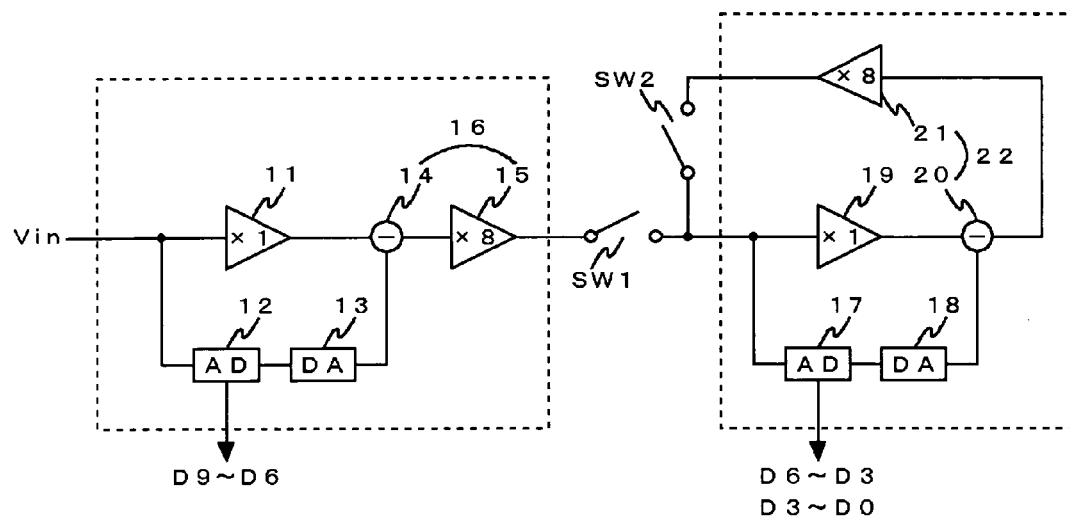
FIG. 3 illustrates the structure of an AD converter circuit according to a comparative example.

FIG. 3 illustrates the structure of an AD converter according to a comparative example. In the AD converter according to the comparative example, a preceding stage of a non-cyclic type converts into 4 bits and a subsequent stage of a cyclic type converts into 3 bits (including the redundant bit) in each cycle. By allowing the subsequent stage to go through 2 cycles, a total of 10 bits are output. The structure of the AD converter is basically the same as that of the first embodiment. A description will be given of a difference.

The gain of the second amplifier circuit 15 in the preceding stage is 8 instead of 4. This is because the number of bits produced by conversion by the second AD converter circuit 17 is 4 including the redundant bit, requiring amplification practically by a gain of 8 (2 raised to the 3rd power). The second AD converter circuit 17 in the subsequent-stage converts into 4 bits including the redundant bit. More specifically, the second AD converter circuit 17 converts into 4 bits (D6–nD3) including the 5th through 7th highest bits and the redundant bit, and 4 bits (D3–D0) including the 8th through 10th highest bits and the redundant bit. The gain of the fourth amplifier circuit 21 is 8 instead of 4. This is also because the number of bits produced by conversion by the second AD converter circuit 17 is 4 including the redundant bit Described above is a difference between the first embodiment and the comparative example.

Thus, according to the AD converter of the first embodiment, the gain of amplification in the subsequent stage of a cyclic type is lowered from 8 to 4, in comparison with the AD converter of the comparative example. The number of voltage comparison elements presenting a load on the analog signal input to the second AD converter circuit 17 is also reduced to half. Accordingly, the operation speed twice to four times as high is achieved in the amplifier circuit.

The number of cycles in the subsequent-stage according to the first embodiment is 3 instead of 2 as in the comparative example. Accordingly, the operation 1.5 times as fast is required for a single cycle in the first embodiment as compared to a single cycle in the comparative example. Given the above-mentioned requirement, the operation speed of amplifier circuit is twice to four times increased, meaning that the operation speed approximately twice as high as the speed of the comparative example is achieved (2–4/1.5=1.3–2.6). Since the number of higher converted bits, which require relatively high precision, remains the same, precision in conversion is maintained.

SECOND EMBODIMENT

The second embodiment also provides an AD converter in which a preceding stage of a non-cyclic type converts into 4 bits and a subsequent stage of a cyclic type converts into 2 bits in each cycle. By allowing the subsequent stage to go through 3 cycles, a total of 10 bits are output. A difference from the first embodiment is that the subsequent stage amplifies in 2 steps.

Figure 4:
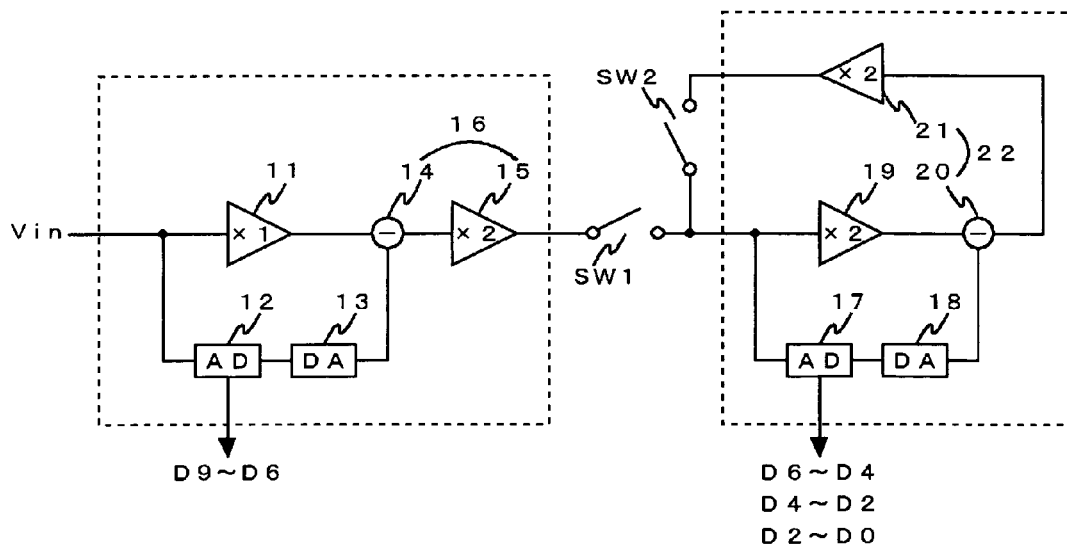
FIG. 4 illustrates the structure of an AD converter circuit according to a second embodiment.

FIG. 4 illustrates the structure of an AD converter according to the second embodiment. A description will be given of the preceding stage of the AD converter. The input analog signal Vin is fed to the first amplifier circuit 11 and the first AD converter circuit 12. The first AD converter circuit 12 converts the input analog signal into a digital value, retrieves the higher 4 bits (D9–D6) and outputs the bits to the encoder (not shown) and the first DA converter circuit 13. The first DA converter circuit 13 converts the digital value produced by conversion by the first AD converter circuit 12 into an analog value. The first amplifier circuit 11 samples the input analog signal, holds the sampled signal for a predetermined period of time, and outputs the signal to the first subtracter circuit 14. The first amplifier circuit 11 does not amplify the analog signal and functions as a sample and hold circuit. The first subtracter circuit 14 subtracts the output of the first DA converter circuit 13 from the output of the first amplifier circuit 11. The second amplifier circuit 15 amplifies the output of the first subtracter circuit 14 by a gain of 2.

In the second embodiment, the reference voltage supplied to voltage comparison elements constituting the second AD converter circuit 17 is set to ½ of the reference voltage supplied to voltage comparison elements constituting the first AD converter circuit 12. With this, the gain required of the second amplifier circuit 15 is lowered from 4, which is the gain required according to the first embodiment, to 2.

A description will now be given of the subsequent stage. The first switch SW1 and the second switch SW2 are alternately turned on and off. The analog signal input from the preceding stage via the first switch SW1 when the first switch SW1 is turned on and the second switch SW2 is turned off is fed to the third amplifier circuit 19 and the second AD converter circuit 17. The second AD converter circuit 17 converts the input analog signal into a digital value, retrieves 3 bits (D6–D4) including the 5th through 6th highest bits and the redundant bit, and outputs the bits to the encoder (not shown) and the second DA converter circuit 18. The second DA converter circuit 18 converts the digital value produced by conversion by the second AD converter circuit 17 into an analog value.

The third amplifier circuit 19 amplifies the input analog signal by a gain of 2 and outputs the amplified signal to the second subtracter circuit 20. The second subtracter circuit 20 subtracts the output of the second DA converter circuit 18 from the output of the third amplifier circuit 19 and outputs the result to the fourth amplifier circuit 21. The output of the second DA converter circuit 18 is amplified by a gain of 2.

A description will be given of a method of amplifying the output of the second DA converter 18 by a gain of 2. A higher reference voltage VRT and a lower reference voltage VRB are supplied to the second AD converter circuit 17 and the second DA converter circuit 18. The second AD converter circuit 17 uses a reference voltage range generated by the higher reference voltage VRT and the lower reference voltage VRB to generate a reference voltage. When a capacitor array is employed for DA conversion, the second DA converter circuit 18 obtains an output voltage by selectively supplying the higher reference voltage VRT and the lower reference voltage VRB to each of a plurality of capacitors (not shown) under the control of the second AD converter circuit 17. The reference voltage range of the second DA converter circuit 18 is also generated based on the higher reference voltage VRT and the lower reference voltage VRB. The reference voltage range of the second AD converter circuit 17 and the reference voltage range of the second DA converter circuit 18 is set to a ratio of 1:2. For example, the ratio can be set to 1:2 by configuring the second AD converter circuit 17 as a single input circuit for input of the reference voltage, and configuring the second DA converter circuit 18 as a differential output circuit.

The fourth amplifier circuit 21 amplifies the output of the second subtracter circuit 20 by a gain of 2. At this point of time, the first switch SW1 is turned off and the second switch SW2 has made a transition to an on state. The analog signal amplified by the fourth amplifier circuit 21 is fed back to the third amplifier circuit 19 and the second AD converter circuit 17 via the second switch SW2. The process described above is repeated so that the second AD converter circuit 17 retrieves 3 bits (D4–D2) including the 7th through 8th highest bits and the redundant bit, and 3 bits (D2–D0) including the 9th through 10th highest bits and the redundant bit. With this, a 10-bit digital value is obtained. The 5th through 10th highest bits are obtained by the subsequent stage of a cyclic type.

In the second embodiment, the gain of 4 required in the subsequent stage is achieved by two-step amplification. More specifically, the third amplifier circuit 19 amplifies by a gain of 2 and the fourth amplifier circuit 21 amplifies by a gain of 2. With this, the gain of the fourth amplifier circuit 21 is lowered to 2, allowing the setting time to be shortened. Accordingly, the half-clock period of the second clock signal CLK2 illustrated in FIG. 2 is reduced so that the operation speed of AD converter as a whole is improved in comparison with the speed of the first embodiment. The legend "Hold" in FIG. 2 indicating the operation of the third amplifier circuit 19 should read "AMP".

Described above is an explanation based on the embodiment. The description of the embodiment is illustrative in nature and various variations in constituting elements and processes involved are possible. Those skilled in the art would readily appreciate that the variations are also within the scope of the present invention.

The first amplifier circuit 11 in the first embodiment is described as a circuit for holding the sampled analog signal. Alternatively, the first amplifier circuit 11 may amplify by a predetermined gain. With this, the gain of the second amplifier circuit 15 can be lowered. For example, the gain of the first amplifier circuit 11 may be configured to 2, and the gain of the second amplifier circuit 15 may be configured to 2. With this, the setting time of the second amplifier circuit 15 is shortened so that the operation speed is improved.

Parameters such as the number of bits produced as a result of conversion, allocation of converted bits, and the gain of the amplifier circuits given in the description above of the embodiments are merely by way of example. Other parameter values may be employed in variations. The present invention is applicable not only to a pipeline comprising two stages but also to a pipeline comprising three or more stages. The requirement is that the number of bits produced in a single cycle of conversion in the subsequent stage is smaller than the number of bits produced by conversion in the preceding stage. In a case where the preceding stage is also of a cyclic type, the number of bits produced by conversion in a single step of conversion in the subsequent stage may be configured to be smaller than the number of bits produced in an initial step of conversion in the preceding stage.

Although the present invention has been described by way of exemplary embodiments, it should be understood that many changes and substitutions may further be made by those skilled in the art without departing from the scope of the present invention which is defined by the appended claims.

What is claimed is:

1. An analog-digital converter converting an input analog signal into a digital value using a plurality of stages, wherein
said plurality of stages include a feedback stage feeding back an output of the stage to an input of the stage, and the number of bits produced in a single cycle of conversion in said feedback stage subsequent to a given stage in said plurality of stages is smaller than the number of bits produced by conversion in said given stage.

2. An analog-digital converter converting an input analog signal into a digital value using a plurality of stages, wherein
a preceding stage amplifies, by a predetermined gain, an analog signal obtained by removal, from an analog signal input to the preceding stage, of an analog signal component corresponding to a digital value derived from analog-to-digital conversion in the preceding stage, and outputs the amplified signal to a subsequent stage,
said subsequent stage is a feedback stage including a subsequent-stage amplifier circuit which amplifies, by a predetermined gain, a difference between an analog signal input from said preceding stage and an analog signal derived from digital-to-analog conversion from a digital value derived from analog-to-digital conversion in the subsequent stage, and which feeds back the amplified difference to an input of the subsequent stage, and
the number of bits produced in a single cycle of conversion in said subsequent stage is smaller than the number of bits produced by conversion in said preceding stage.

3. An analog-digital converter converting an input analog signal into a digital value using a plurality of stages, wherein
a preceding stage amplifies, by a predetermined gain, an analog signal obtained by removal, from an analog signal input to the preceding stage, of an analog signal component corresponding to a digital value derived from analog-to-digital conversion in the preceding stage, and outputs the amplified signal to a subsequent stage,
said subsequent stage is a feedback stage including a first subsequent-stage amplifier circuit amplifying an analog signal input from said preceding stage by a first predetermined gain, and a second subsequent-stage amplifier circuit amplifying, by a second predetermined gain, a difference between an analog signal output from said first subsequent-stage amplifier, and an analog signal which is derived from digital-to-analog conversion from a digital value derived from analog-to-digital conversion in the subsequent stage, and which is amplified by a gain practically identical with said first predetermined gain, the second subsequent-stage amplifier circuit feeding back the amplified difference to an input of the subsequent stage, and
the number of bits produced in a single cycle of conversion in said subsequent stage is smaller than the number of bits produced by conversion in said preceding stage.

4. The analog-digital converter according to claim 1, wherein, in a case where said given stage in said plurality of stages is a stage that feeds back to an input of said given stage as well as outputting to said feedback stage, the number of bits produced by conversion in a single step of conversion in said feedback stage is configured to be smaller than the number of bits produced in an initial step of conversion in said given stage.

5. The analog-digital converter according to claim 2, wherein, in a case where said preceding stage is a feedback stage that feeds back to an input of said preceding stage as well as outputting to said subsequent stage, the number of bits produced by conversion in a single step of conversion in said subsequent stage is configured to be smaller than the number of bits produced in an initial step of conversion in said preceding stage.

6. The analog-digital converter according to claim 3, wherein, in a case where said preceding stage is a feedback stage that feeds back to an input of said preceding stage as well as outputting to said subsequent stage, the number of bits produced by conversion in a single step of conversion in said subsequent stage is configured to be smaller than the number of bits produced in an initial step of conversion in said preceding stage.

7. The analog-digital converter according to claim 1, wherein the number of bits produced by conversion in said feedback stage is set to 2, excluding a redundant bit.

8. The analog-digital converter according to claim 2, wherein the number of bits produced by conversion in said subsequent stage is set to 2, excluding a redundant bit.

9. The analog-digital converter according to claim 3, wherein the number of bits produced by conversion in said subsequent stage is set to 2, excluding a redundant bit.

10. The analog-digital converter according to claim 4, wherein the number of bits produced by conversion in said feedback stage is set to 2, excluding a redundant bit.

11. The analog-digital converter according to claim 5, wherein the number of bits produced by conversion in said subsequent stage is set to 2, excluding a redundant bit.

12. The analog-digital converter according to claim 6, wherein the number of bits produced by conversion in said subsequent stage is set to 2, excluding a redundant bit.

13. The analog-digital converter according to claim 1, wherein said feedback stage comprises:
- a first amplifier circuit amplifying an analog signal input from said given stage by a predetermined gain;
- an analog-digital converter circuit converting an analog signal input from said given stage into a digital value of a predetermined number of bits;
- a digital-analog converter converting an output of said analog-digital converter circuit into an analog signal;
- a subtracter circuit subtracting an output of said digital-analog converter circuit from an output of said first amplifier circuit; and
- a second amplifier circuit amplifying an output of said subtracting circuit by a predetermined gain.

14. The analog-digital converter according to claim 13, wherein said first amplifier circuit functions as a sample and hold circuit.

15. The analog-digital converter according to claim 2, wherein said subsequent stage comprises:
- an analog-digital converter circuit converting the analog signal input from said preceding stage into a digital value of a predetermined number of bits; and
- a digital-analog converter circuit converting an output of said analog-digital converter circuit into an analog signal.

16. The analog-digital converter according to claim 3, wherein said subsequent stage comprises:
- an analog-digital converter circuit converting the analog signal input from said preceding stage into a digital value of a predetermined number of bits; and
- a digital-analog converter circuit converting an output of said analog-digital converter circuit into an analog signal.

17. The analog-digital converter according to claim 2, wherein the frequency of a clock signal controlling said subsequent stage is configured to be three times that of a clock signal controlling said preceding stage.

18. The analog-digital converter according to claim 3, wherein the frequency of a clock signal controlling said subsequent stage is configured to be three times that of a clock signal controlling said preceding stage.

19. The analog-digital converter according to claim 8, wherein the frequency of a clock signal controlling said subsequent stage is configured to be three times that of a clock signal controlling said preceding stage.

20. The analog-digital converter according to claim 9, wherein the frequency of a clock signal controlling said subsequent stage is configured to be three times that of a clock signal controlling said preceding stage.

* * * * *